Sept. 4, 1973 D. G. GOODMAN 3,756,872

METHOD OF MAKING NON-PLANAR SEMI-CONDUCTOR DEVICES

Filed Oct. 6, 1969 2 Sheets-Sheet 1

INVENTOR
DENNIS GEORGE GOODMAN
BY Holman, Glascock, Downing & Seebold
ATTORNEYS

INVENTOR
DENNIS GEORGE GOODMAN
BY Holman, Glascock, Downing & Seebold
ATTORNEYS

United States Patent Office 3,756,872

Patented Sept. 4, 1973

3,756,872

METHOD OF MAKING NON-PLANAR SEMI-CONDUCTOR DEVICES

Dennis George Goodman, Birmingham, England, assignor to Joseph Lucas (Industries) Limited, Birmingham, England Filed Oct. 6, 1969, Ser. No. 863,984
Claims priority, application Great Britain, Oct. 28, 1968, 51,035/68; May 16, 1969, 24,991/69
Int. Cl. H01l 7/34
U.S. Cl. 148—187 10 Claims

ABSTRACT OF THE DISCLOSURE

In the manufacture of a semi-conductor device, a wafer with at least one p zone and at least one n zone is positioned on a support and divided into a plurality of parts each of which is to constitute a device, channels being defined between the devices and p-n junctions being exposed in the channels. A curable compound is then poured into the channels, this compound being capable of protecting the p-n junctions, and finally the compound is cured so as to form a protective film over the junctions.

This invention relates to the manufacture of semiconductor devices, and the various features of the invention will be seen from the claims.

Figures 1, 2, 3, 4, 5, 6:
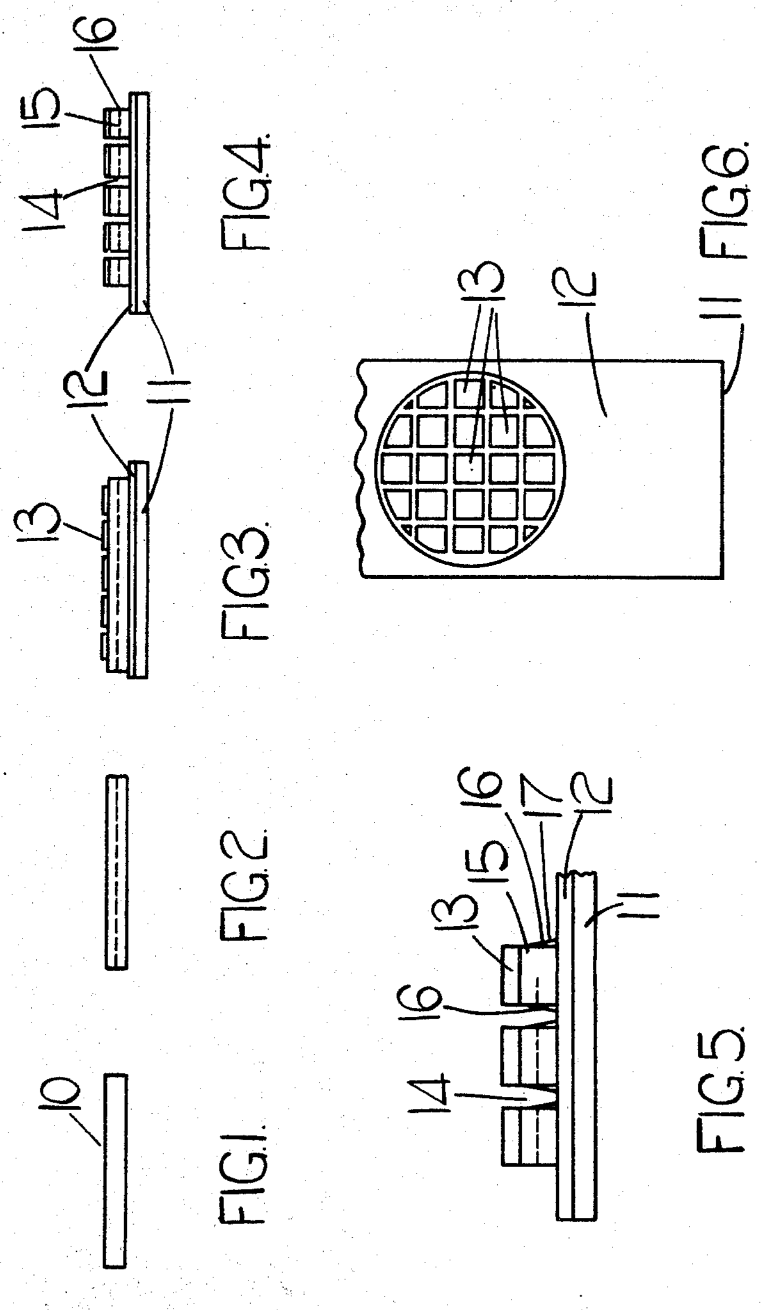
Figures 7, 8, 9, 10, 11, 12, 13:
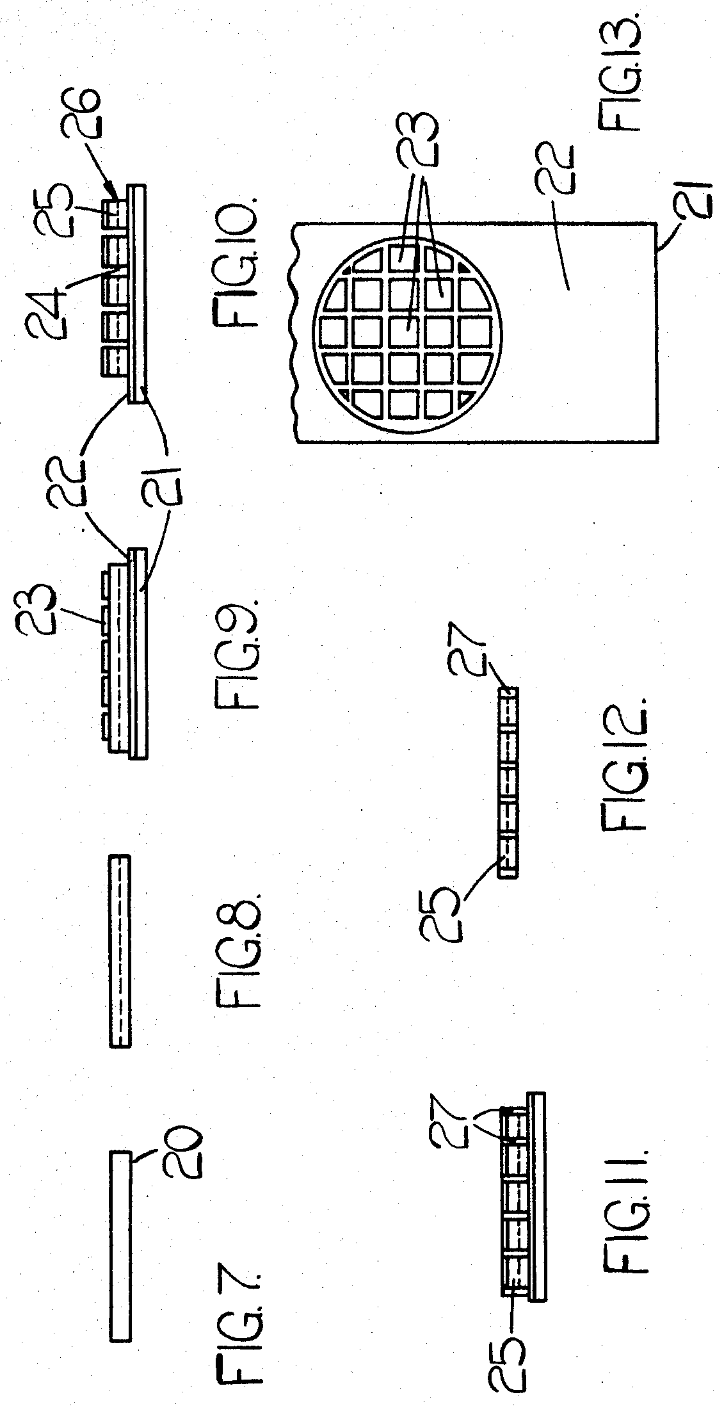

In the accompanying drawings,

FIGS. 1 to 5 are sectional views illustrating five stages during the manufacture of diodes according to one example of the invention, FIG. 5 being to an enlarged scale, FIG. 6 is a plan view of FIG. 3, FIGS. 7 to 12 are sectional views illustrating six stages during the manufacture of diodes according to a second example of the invention, and FIG. 13 is a plan view of FIG. 9.

Referring to FIGS. 1 to 6, a silicon wafer 10 of p, or n-type material is treated by known diffusion techniques to form a p-n junction (FIG. 2). After the p-n junction has been formed, suitable metal layers (not shown) are deposited onto the surfaces of the wafer to facilitate the making of subsequent electrical connections to the diodes to be produced. The wafer 10 is then secured to a glass or ceramic slide 11 by means of a thin layer 12 of wax. A steel mask (not shown) containing a plurality of rectangular holes is then positioned on top of the wafer and a wax solution is sprayed onto the wafer through the mask. The wax adheres to the wafer so that when the mask is removed the surface of the wafer includes a plurality of rectangular areas 13 which are coated with wax (FIG. 3). The slide 11 carrying the wafer is then immersed in an etchant which removes the regions of the wafer between the areas 13 (FIG. 4). It will be appreciated that the wax which is used to secure the wafer to the slide, and the wax masking the areas 13 of the wafer is so chosen that it is unaffected by the etchant. Etchant resisting materials other than waxes can of course be used.

When the exposed areas of the wafer have been etched away the slide 11 is removed from the etchant and is washed and dried. At this stage the slide carries a plurality of rectangular p-n diodes 15 which are separated by channels 14 in each of which a p-n junction is exposed, the diodes still being secured to one another through the slide.

A solution consisting of approximately 5% silicone resin, a catalyst, (for example zinc acetate) and a volatile carrier is then poured onto the slide 11 and is caused to flow into the channels 14 between the diodes 15 (FIG. 5). When the exposed, etched edges 16 of the diodes 15 are coated with the solution the slide is exposed to a current of warm air which causes the volatile carrier to evaporate leaving the varnish and its catalyst on the exposed, etched edges of the diodes. The slide is then placed in an oven, at a temperature of between 105 and 115° C. for a period of forty-eight hours during which time the silicone resin is cured and forms a thin protective adherent film 17 on the previously exposed edges 16 of the diodes 15.

When the film 17 on the edges 16 of the diodes has been cured, the slide 11 is removed from the oven and is washed in a solvent, for example trichloroethylene, which dissolves the wax coating the upper and lower surface of the wafer 15 but which does not attack the film 17. The diodes 15 are removed from the slide 11 when the wax dissolves and are then placed in an oven for a further period to ensure that the film on the edges 16 is fully cured, whereafter the diodes are ready for testing. After testing, contacts are made to the diodes by soldering and the diodes are mounted in any convenient manner.

The volatile carrier can take a variety of forms, but an alcohol or ketone is preferred. The resin used in the preferred example is of the form

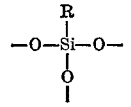

where R is the methyl group, and this resin gives the best results in the particular example described, because when cured it is unaffected by the solvent which is used to remove the wax, is capable of withstanding the temperature attained in the soldering process, and is not damaged by the mechanical handling of the diodes. However, the requirements for the resin will vary with the particular application. By way of example, the diodes 15 could be located on a resilient support and then scribed, after which the support is stretched to separate the diodes, which will still be located on the support with channels between them. The resin can be used as described above, but it need not now be resistant to the solvent, since there is no wax to be removed. In some applications soldering may be carried out at low temperature, in which case the ability of the resin to withstand temperature is less critical. Moreover, in some cases the diode may be potted after the contacts have been made, and then it does not matter if the soldering process removes the protective film, because the film will be replaced by the potting material. It is found that best results are obtained with silicone resins of the form

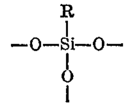

or

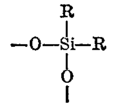

or mixtures thereof, where R is an aryl or an alkyl grouping. In the case of an aryl grouping, phenyl is preferred, and in the case of an alkyl grouping $C_nH_{2n+1}$, *n* is preferably 1 to 6 with methyl being preferred.

In one modification of the example described, the diffusion process is only partly completed at the stage shown in FIG. 2, and the required drive-in takes place during curing.

In another modification, etching at the stage shown in FIG. 4 is stopped after the p-n junctions are exposed but before the n-type layer is completely severed. The process continues as described but with the diodes all interconnected. The diodes are separated as required by scribing and cracking.

In a further example, protection is afforded to one or more exposed junctions on an individual device formed in any convenient known manner by coating them or each exposed junction with an adherent film of a cured silicone resin material, preferably the resin used in the example shown in FIGS. 1 to 6.

Referring to FIGS. 7 to 13, a silicon wafer 20 of p, or n-type material is treated by known diffusion techniques to form a p-n junction (FIG. 8). After the p-n junction has been formed, suitable metal layers (not shown) are plated onto the surfaces of the wafer to facilitate the making of subsequent electrical connections to the diodes to be produced. The wafer containing the p-n junctions is then secured to a glass or ceramic slide 21 by means of a thin layer 22 of wax. A steel mask (not shown) containing a plurality of rectangular holes is placed in position on top of the wafer, and a wax solution is sprayed onto the mask. The wax enters the apertures in the mask and adheres to the wafer so that when the mask is removed, the surface of the wafer includes a plurality of rectangular areas 23 which are coated with wax (FIG. 9). The slide 21 carrying the wafer is then immersed in an etchant which removes the regions of the wafer between the masked areas 23 (FIG. 10). It will be appreciated that the wax which is used to secure the disc to the slide, and the wax masking the areas 23 of the wafer is so chosen that it is unaffected by the etchant. When the exposed areas of the wafer have been etched away the slide 21 is removed from the etchant and is washed and dried. At this stage the slide carries a plurality of small rectangular p-n diodes 25 which are separated from one another and which are coated on both faces with wax, only the etched edges 26 of the diodes 25 being exposed. Etchant resistant materials other than waxes can of course be used.

A silicon-based cross-linked synthetic rubber material, in liquid form, is then poured onto the slide and is caused to flow into the spaces 14 between the diodes (FIG. 11). When the spaces 24 are filled with liquid rubber the surface of the etched wafer is wiped to remove excess rubber, leaving a network 27 of liquid rubber in the spaces 24. The liquid rubber is then cured and the slide is placed in a bath of liquid in which the wax is soluble. The wax covering the diodes 25, and the wax securing the diodes to the slide 22 dissolves leaving the diodes 25 secured together by a rubber membrane 27 (FIG. 12). Thus both faces of the diodes 25 are clean and the edges of the diodes 25 are protected by the membrane 27.

When it is required to utilise one of the diodes 25 the portion of the membrane 27 securing the die to the remaining diode is severed leaving a separated diode with its edges protected by the severed portions of the membrane.

When the diode has connections made thereto by a high temperature soldering process, the soldering temperature can be chosen so as to decompose the rubber protecting the edges of the diode, thereby leaving the edges of the diode clean, ready for potting. However, the rubber may remain in position throughout the life of the diode. Moreover, in this example the rubber can be employed to facilitate handling without any protection of the p-n junctions.

It is not essential that the membrane material should be flexible. Materials which produce a brittle membrane can be used, in which case the diodes are separated from one another by fracturing rather than by severing, the membrane.

Although both examples shown relate to diodes, it will of course be understood that the invention can be used in manufacturing transistors, thyristors and semi-conductor devices generally.

It is to be understood that the term "silicone resin" is used in the description and claims in its widely accepted sense, which excludes silicone rubbers.

Having thus described my invention what I claim as new and desire to secure by Letters Patent is:

1. A method of manufacturing semi-conductor devices comprising the following steps:

(i) forming a wafer with at least one p-type zone and at least one n-type zone, (ii) securing the wafer to a slide by a layer of wax or other etchant resistant material and coating the exposed surface of the wafer with isolated areas of wax or other etchant resistant material, (iii) treating the wafer with an etchant which does not attack the wax or other etchant resistant material, the etchant forming in the areas of the wafer between the wax or other etchant resistant material channels in each of which a p-n junction is exposed, the channels dividing the wafer into a plurality of separate devices which remain secured to the slide, (iv) pouring into the channels a curable compound capable of protecting the p-n junctions, (v) curing the compound so as to form a protective film over the junctions, (vi) removing the wax or other etchant resistant material.

2. A method as claimed in claim 1 in which the curable compound is a cross-linked synthetic rubber material which forms a membrane which interconnects the devices as well as protecting the p-n junctions.

3. A method as claimed in claim 2 including the step of making metallic, electrical connections to the devices by soldering, the soldering operation decomposing the membrane.

4. A method as claimed in claim 2 including the step of making metallic, electrical connections to the devices by soldering, the soldering operation leaving the membrane in tact.

5. A method as claimed in claim 1 in which the curable compound is a silicone resin.

6. A method as claimed in claim 5 in which the compound is of the form

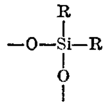

where R is an aryl or an alkyl grouping.

7. A method as claimed in claim 5 in which the compound is of the form

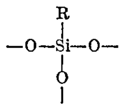

where R is an aryl or an alkyl grouping.

8. A method as claimed in claim 7 where R is the methyl grouping.

9. A method as claimed in claim 7 where R is the phenyl grouping.

10. A method of manufacturing non-planar semiconductor devices, comprising the following steps:

(i) forming a non-planar wafer with at least one p-zone and at least one n-zone.

(ii) with the wafer positioned on a support, dividing the wafer into a plurality of parts each of which is to constitute a device, channels being defined between the devices and p-n junctions being exposed in the channels, (iii) pouring into the channels a curable compound, (iv) curing the compound so as to form a membrane interconnecting the devices to facilitate handling thereof.

(References on following page)

References Cited

UNITED STATES PATENTS

| | | | |
|---|---|---|---|
| 3,158,788 | 11/1964 | Last | 317—234 |
| 3,276,105 | 10/1966 | Alais et al. | 29—588 |
| 3,332,143 | 7/1967 | Gentry | 29—588 |
| 3,343,255 | 9/1967 | Donovan | 29—583 |
| 3,432,919 | 3/1969 | Rosvold | 317—235 |
| 3,046,176 | 7/1962 | Rosenburg | 156—11 |

OTHER REFERENCES

Rochow: "Chemistry of the Silicones," 2nd edition, Wiley & Sons, New York, 1951, pp. 70 and 184–5.

L. DEWAYNE RUTLEDGE, Primary Examiner

J. M. DAVIS, Assistant Examiner

U.S. Cl. X.R.

29—588; 117—201; 148—1.5; 317—234 R